United States Patent Office 3,258,427

Patented June 28, 1966

3,258,427

SILVER AND COPPER HALIDE DOPED $Bi_2Te_3$–$As_2Se_3$ THERMOELECTRIC MATERIAL

Joachim Rupprecht, Nurnberg, Germany, assignor to Siemens-Schuckertwerke Aktiengesellschaft, Berlin, Germany, and at Erlangen, Germany, and elsewhere, a corporation of Germany No Drawing. Filed Oct. 19, 1962, Ser. No. 231,858

Claims priority, application Germany, Oct. 21, 1961, S 76,365

5 Claims. (Cl. 252—62.3)

My invention relates to thermoelectric materials and methods of their manufacture, and particularly to materials of n-type electric conductance for use as thermocouple legs in Peltier cooling devices.

The two legs of thermocouples now preferentially employed for electric cooling on the Peltier principle consist of semiconductor materials having n-type and p-type conductance respectively. The suitability of a semiconductor material for use in such Peltier couples is characterized by largest feasible thermoelectric effectivity $$z=\frac{\alpha^2\cdot\sigma}{\kappa}$$

wherein $\alpha$ denotes the differential thermoforce, $\sigma$ the electrical conductance, and $\kappa$ the thermal conductance. It has been proposed to employ as n-type thermocouple legs a semiconductor material consisting of a mix crystal of bismuth telluride ($Bi_2Te_3$) and arsenic selenide ($As_2Se_3$).

I have discovered that the thermoelectric properties, particularly the thermoelectric effectivity and hence the suitability for thermoelectric cooling, of such mix-crystal semiconductors is greatly increased by providing a mix crystal of the system $Bi_2Te_3$–$As_2Se_3$, for optimal n-type doping, with a halide of metal from subgroup B in the first group of the periodic system (Cu, Ag, Au).

I have found that an especially effective, optimal degree of n-doping is obtained by giving such a mix-crystal semiconductor body a dopant content of 0.05 to 0.07% by weight of copper bromide or approximately 0.1% by weight of silver iodide.

Particularly advantageous is the application of these dopant additions in the semiconductor n-type mix crystal whose percentive molecular composition is in the range from 70 mole percent $Bi_2Te_3$ and 30 mole percent $As_2Se_3$ to 90 mole percent $Bi_2Te_3$ and 10 mole percent $As_2Se_3$.

Mix crystals of the system $Bi_2Te_3$–$As_2Se_3$ doped for n-type conductance by means of halogenides according to the invention and having, for example, a mix-crystal composition of 80 mole percent $Bi_2Te_3$ and 20 mole percent $As_2Se_3$, have been found to possess a thermoelectric effectivity $z$ of about $4.0\cdot10^{-3}$ degree$^{-1}$. This effectivity is superior to all heretofore known thermoelectric n-type materials at room temperature. The highest values of effectivity heretofore known from n-type mix crystals of the system $Bi_2Te_3$–$Bi_2Se_3$ were up to $2.9\cdot10^{-3}$ degree$^{-1}$. I am not yet in a position to explain the surprising discovery according to my invention that the mix crystals, formed by the thermoelectrically not very effective semiconductors $Bi_2Te_3$ and $As_2Se_3$, if suitably doped and produced with the aid of the above-mentioned halogenides, particularly bromides and iodides of copper or silver, surpass in thermoelectric effectivity all n-type materials heretofore available for such purposes.

A mix-crystal material according to the invention, when properly combined with any one of the known and suitable p-type thermocouple materials known for such purposes, effects a more efficient Peltier cooling action resulting in a higher cooling power or a greater reduction in temperature under otherwise comparable conditions. Since the invention does not concern itself with the particular p-type legs of the thermocouples nor with the particular design of the thermoelectric devices, they are not further described herein. However, if desired, reference as to such information may be had to the copending applications Serial No. 212,411, filed July 25, 1962 now Patent No. 3,211,656; Serial No. 195,441, filed May 17, 1962; Serial No. 150,701, filed Nov. 7, 1961; Serial No. 174,442, now Patent No. 3,220,199, filed February 20, 1962; and Serial No. 192,254, filed May 3, 1962, assigned to the assignee of the present invention.

Suitable for the production of mix crystals according to the invention are particularly a "normal freezing"-method or the application of a zone-melting method, as will be apparent from the examples described presently.

EXAMPLE 1 ("NORMAL-FREEZING" METHOD)

Stoichiometric quantities in pulverulent form of the four component elements of the mix-crystal $Bi_2Te_3$–$As_2Se_3$ were employed with a purity degree of 99.999%. The powder quantities were placed into an elongated tubular quartz ampule together with 0.05% by weight of copper bromide to serve as doping substance. The quartz ampule was evacuated and then sealed. Thereafter, the quartz ampule was placed into a melting furnace and heated to a temperature of 600° C. After the ampule and its content had reached this temperature, the ampule was lowered out of the melting furnace at a rate of 0.6 cm. per hour so that the molten material was subjected to normal freezing progressing from one end of the elongated ampule to the other. As a result, a polycrystalline mix crystal of rod shape was obtained having a diameter of 10 mm., corresponding to the melting space in the ampule.

EXAMPLE 2 (ZONE-MELTING METHOD)

The elements of the composition were used with a purity of 99.999%. Added to the elemental components of the mix crystal was about 0.1% by weight of silver iodide to serve as dopant. The materials, employed in pulverulent form as in Example 1, were melted together in an evacuated quartz ampule of elongated shape and thereafter permitted to solidify to a rod-shaped solid structure. Thereafter the rod in the quartz ampule, which remained evacuated and fused off, was subjected to zone levelling by pulling a melting zone once in forward and return direction lengthwise through the rod. The zone temperature used was 600° C. The zone-pulling rate was 6 cm. per hour.

The following Table 1 indicates the thermoelectric properties of a mix crystal according to the invention composed of 80 mole percent $Bi_2Te_3$ and 20 mole percent $As_2Se_3$ in dependence upon different amounts of copper bromide dopant. The indicated values relate to a temperature of 25° C. It will be noted from Table 1 that the optimal n-doping with copper bromide is in the range of about 0.05 to about 0.07% by weight of copper bromide.

*Table 1*

[80 mole percent $Bi_2Te_3$–20 mole percent $As_2Se_3$ at 25° C.]

| Percent CuBr (by weight) | 0 | 0.02 | 0.05 | 0.07 | 0.1 |
|---|---|---|---|---|---|
| Thermoforce $\alpha$(/$\mu$v./degree) | 265 | 216 | 194 | 173 | 158 |
| Spec.electr.resistance $\rho\cdot10^3$($\Omega$.cm.) | 3.9 | 2.1 | 1.1 | 0.8 | 0.71 |
| Thermal conductance $\kappa.10^2$ (w./cm.-degree) | 0.6 | 0.66 | 0.83 | 0.95 | 1.0 |
| Thermoelectr. effectivity $z.10^3$ (degree$^{-1}$) | 3.0 | 3.3 | 4.1 | 3.9 | 3.5 |

The following Table 2 indicates the thermoelectric properties of three mix crystals of the system $Bi_2Te_3$–$As_2Se_3$ without dopant. The listed values also relate to a temperature of 25° C.

*Table 2*

[Three mix crystals of the system $Bi_2Te_3$–$As_2Se_3$ at 25° C. without dopant

| | Composition in mole percent | | |
|---|---|---|---|
| $Bi_2Te_3$ | 70 | 80 | 90 |
| $As_2Se_3$ | 30 | 20 | 10 |
| Thermoforce $\alpha$(/$\mu$v./degree) | 310 | 265 | 243 |
| Spec.electr.resistance $\rho \cdot 10^{+3}$($\Omega$.cm.) | 8.0 | 3.9 | 2.8 |
| Thermal conductance $\kappa . 10^{-2}$ (w./cm.degree) | 0.54 | 0.6 | 1.1 |
| Thermoelectr.effectivity $z \cdot 10^3$ (degree$^{-1}$) | 2.2 | 3.0 | 1.9 |

It is apparent from Table 2 that toward higher amounts of $As_2Se_3$, a decreasing electric conductivity (increased specific electric resistance) is accompanied by a reduction in thermoelectric effectivity. Furthermore, the specimens become increasingly vitreous with excessively high proportions of $As_2Se_3$. Mix crystals with a very high content of $Bi_2Te_3$ obviously possess a disadvantageously high thermal conductance due to the influence of the still hardly disturbed $Bi_2Te_3$ crystal lattice. All of the mix-crystal alloys of the range covered by Table 2 can be improved with respect to thermoelectric effectivity by having the above-mentioned halogenide dopants of the good-conductor metals from the subgroup B in the first group of the periodic system of elements.

Also suitable as dopants in mix crystals of $Bi_2Te_3$ and $As_2Se_3$ for the purposes of the invention are CuI, CuCl, $CuF_2$, AgBr, AgCl, AgF, AuBr, AuI, AuCl. As a rule, copper halide can be used in a dopant quantity of about 0.05% by weight of the mix crystal. The silver halide and gold halide, as a rule, can be used in a quantity of about 0.1% by weight.

I claim:

1. A thermoelectric semiconductor consisting essentially of an n-type mix crystal of $Bi_2Te_3$ and $As_2Se_3$ having a molecular composition between 70 to 90 mole percent $Bi_2Te_3$ and 30 to 10 mole percent $As_2Se_3$, and containing as donor dopant from 0.5 to 0.1% by weight a metal halide selected from the group consisting of the halides of silver and copper.

2. A thermoelectric semiconductor consisting essentially of an n-type mix crystal of $Bi_2Te_3$ and $As_2Se_3$ having a molecular composition between 70 to 90 mole percent $Bi_2Te_3$ and 30 to 10 mole percent $As_2Se_3$, and containing 0.05 to 0.07% by weight of copper bromide.

3. A thermoelectric semiconductor consisting essentially of an n-type mix crystal of $Bi_2Te_3$ and $As_2Se_3$ having a molecular composition between 70 to 90 mole percent $Bi_2Te_3$ and 30 to 10 mole percent $As_2Se_3$, and containing approximately 0.1% silver iodide.

4. The method of producing a thermoelectric semiconductor consisting essentially of an n-type mix crystal of $Bi_2Te_3$ and $As_2Se_3$, having a molecular composition between 70 to 90 mole percent $Bi_2Te_3$ and 30 to 10 mole percent $As_2Se_3$, and which comprises placing the mix-crystal components into a quartz ampule together with halide of a metal selected from the group consisting of silver and copper of the periodic system in a dopant quantity from 0.05 to 0.1% by weight, sealing and evacuating the ampule, heating the ampule in a heating zone to a temperature of at least 600° C., and gradually removing the ampule from the heating zone at normal-freezing rate.

5. The method of producing a thermoelectric semiconductor consisting essentially of an n-type mix crystal of $Bi_2Te_3$ and $As_2Se_3$, having a molecular composition between 70 to 90 mole percent $Bi_2Te_3$ and 30 to 10 mole percent $As_2Se_3$, and which comprises melting the mix-crystal components in an evacuated ampule together with halide of metal selected from the group consisting of silver and copper in a dopant quantity from 0.05 to 0.1% by weight, and subjecting the resulting body of material in the ampule to zone levelling in a single forward and return pass of the melting zone at a zone temperature of about 600° C. and at a zone-pulling rate of about 6 cm. per hour.

References Cited by the Examiner

Egli: Thermoelectricity, John Wiley & Sons, 1960, pp. 136–145.

TOBIAS E. LEVOW, *Primary Examiner.*

R. D. EDMONDS, *Assistant Examiner.*